US009863666B1

(12) United States Patent
Nesmith

(10) Patent No.: US 9,863,666 B1
(45) Date of Patent: Jan. 9, 2018

(54) HELIOSTAT WITH STOWING AND WIND SURVIVAL CAPABILITIES

(71) Applicant: The United States of America as Represented by the Administrator of NASA, Washington, DC (US)

(72) Inventor: Bill J. Nesmith, Tujunga, CA (US)

(73) Assignee: The United States of America as Represented by the Administrator of the National Aeronautics and Space Administration, Washington, DC (US)

( * ) Notice: Subject to any disclaimer, the term of this patent is extended or adjusted under 35 U.S.C. 154(b) by 666 days.

(21) Appl. No.: 14/447,993

(22) Filed: Jul. 31, 2014

Related U.S. Application Data

(60) Provisional application No. 61/865,941, filed on Aug. 14, 2013.

(51) Int. Cl.
  *F24J 2/54* (2006.01)
  *F24J 2/00* (2014.01)
  *H01L 31/052* (2014.01)

(52) U.S. Cl.
  CPC ............... *F24J 2/541* (2013.01); *F24J 2/00* (2013.01); *H01L 31/052* (2013.01)

(58) Field of Classification Search
  None
  See application file for complete search history.

(56) References Cited

U.S. PATENT DOCUMENTS

| | | | | | |
|---|---|---|---|---|---|
| 3,553,701 | A | * | 1/1971 | Thomas | H01Q 1/1242 343/766 |
| 4,425,904 | A | * | 1/1984 | Butler | F24J 2/14 126/606 |
| 4,466,423 | A | * | 8/1984 | Dolan | F24J 2/16 126/571 |
| 4,762,298 | A | * | 8/1988 | Wood | F16M 11/126 126/573 |
| 4,875,467 | A | * | 10/1989 | Murphy | F24J 2/125 126/600 |
| 4,995,377 | A | * | 2/1991 | Eiden | F24J 2/5431 126/605 |
| 5,325,844 | A | * | 7/1994 | Rogers | F24J 2/10 126/600 |
| 8,540,382 | B1 | * | 9/2013 | Hultberg | G01S 3/7861 359/838 |
| 9,454,001 | B2 | * | 9/2016 | Lehmann | F24J 2/1052 |
| 9,506,783 | B2 | * | 11/2016 | Fukuba | F24J 2/40 |
| 9,599,441 | B2 | * | 3/2017 | Stocke, Jr. | H01Q 17/00 |
| 2006/0201498 | A1 | * | 9/2006 | Olsson | F24J 2/16 126/605 |
| 2009/0038608 | A1 | * | 2/2009 | Caldwell | F24J 2/07 126/600 |

(Continued)

FOREIGN PATENT DOCUMENTS

KR  2013075937 A * 7/2013 ........... H01L 31/052

*Primary Examiner* — Gregory Huson
*Assistant Examiner* — Nikhil Mashruwala
(74) *Attorney, Agent, or Firm* — Mark Homer

(57) ABSTRACT

A low cost thin-film based heliostat with advanced stowing and wind survival capabilities. The heliostat may include a plurality of reflective surfaces held together via a plurality of double acting magnetic hinges. The heliostat may also include a drive mechanism attached to a post, and configured to stow the plurality of facets in any desired position.

5 Claims, 6 Drawing Sheets

(56) References Cited

U.S. PATENT DOCUMENTS

| | | | |
|---|---|---|---|
| 2009/0107484 A1* | 4/2009 | Bender | F24J 2/4638 |
| | | | 126/569 |
| 2009/0107542 A1* | 4/2009 | Bender | F24J 2/10 |
| | | | 136/246 |
| 2009/0277440 A1* | 11/2009 | Angel | C03B 23/0256 |
| | | | 126/601 |
| 2010/0263709 A1* | 10/2010 | Norman | F24J 2/07 |
| | | | 136/246 |
| 2011/0241834 A1* | 10/2011 | McAllister | G06K 19/07749 |
| | | | 340/10.1 |
| 2012/0073625 A1* | 3/2012 | Christensen | F24J 2/5271 |
| | | | 136/246 |
| 2013/0047609 A1* | 2/2013 | Schmaelzle | F03G 6/067 |
| | | | 60/641.11 |
| 2013/0047977 A1* | 2/2013 | Schmaelzle | F24J 2/38 |
| | | | 126/605 |
| 2014/0042296 A1* | 2/2014 | Garrido | F24J 2/16 |
| | | | 250/203.4 |
| 2014/0261632 A1* | 9/2014 | Clavelle | F24J 2/14 |
| | | | 136/248 |
| 2014/0345277 A1* | 11/2014 | Dang | F03G 6/06 |
| | | | 60/641.15 |
| 2015/0000278 A1* | 1/2015 | Furutani | F24J 2/5427 |
| | | | 60/641.15 |
| 2015/0007673 A1* | 1/2015 | Hultberg | G02B 5/10 |
| | | | 74/5.4 |
| 2015/0185433 A1* | 7/2015 | Nakamura | G02B 7/183 |
| | | | 359/853 |
| 2016/0226437 A1* | 8/2016 | Tamaura | G02B 26/0816 |
| 2017/0179879 A1* | 6/2017 | Hendricks | H02S 40/44 |

\* cited by examiner

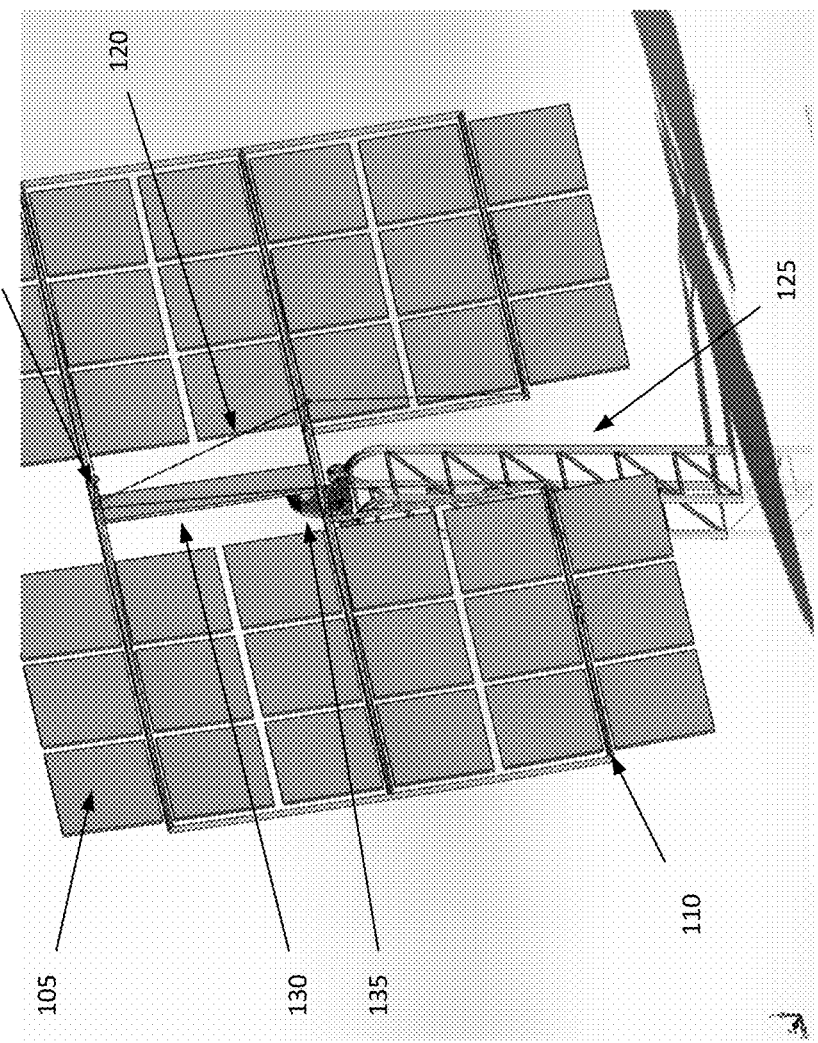

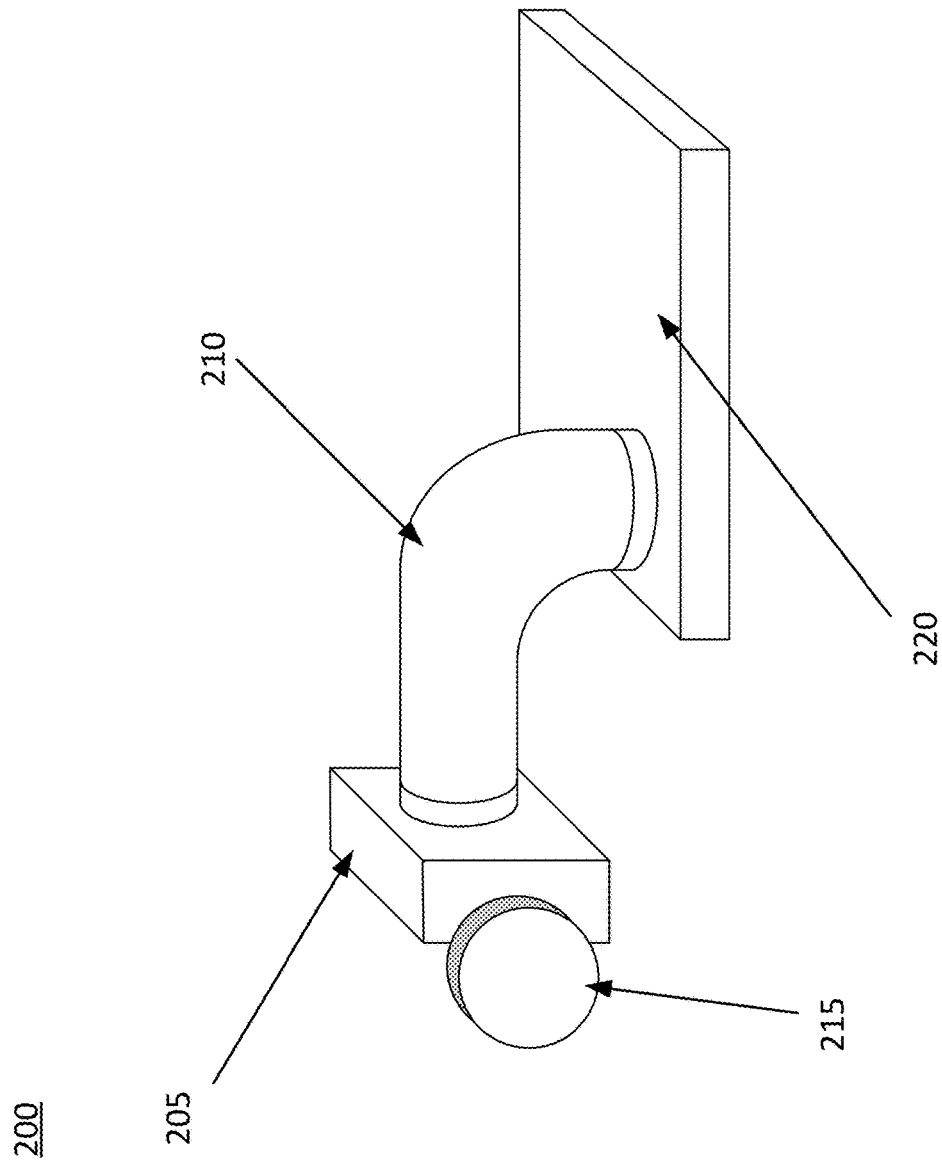

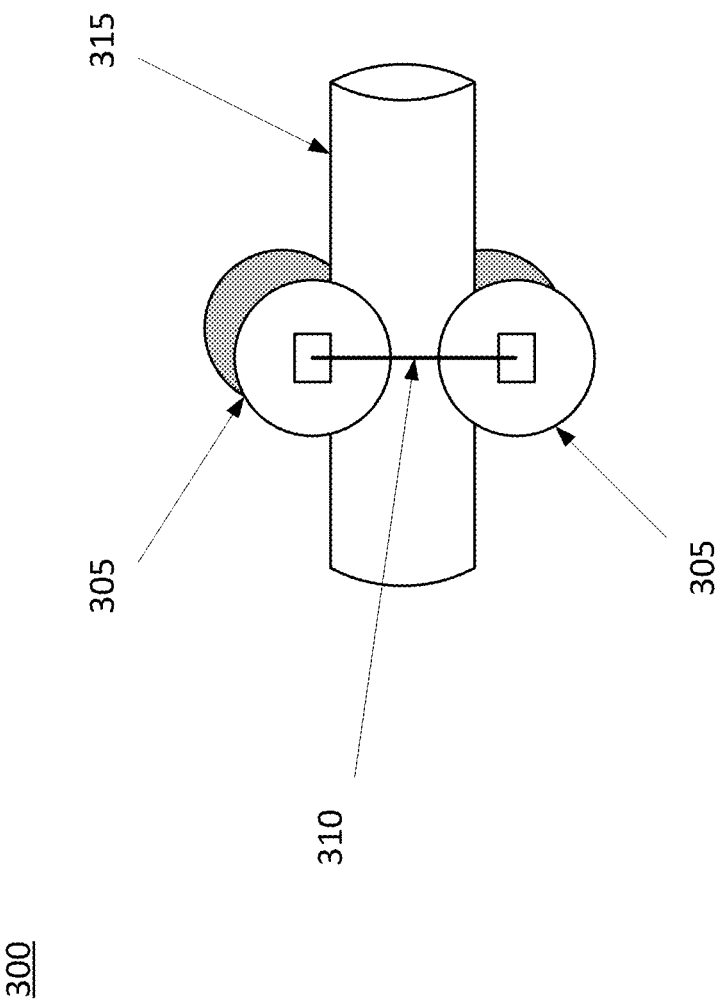

HELIOSTAT WITH STOWING AND WIND SURVIVAL CAPABILITIES

CROSS-REFERENCE TO RELATED APPLICATIONS

The present application derives priority from U.S. provisional application No. 61/865,941 filed on Aug. 14, 2013.

ORIGIN OF THE INVENTION

Embodiments of the present invention described herein were made in the performance of work under NASA contract NNN12AA01C and are subject to the provisions of Public Law #96-517 (35 U.S.C. §202) in which the Contractor has elected not to retain title.

FIELD

The present invention generally pertains to a heliostat and, more particularly, to a heliostat with stowing capabilities.

BACKGROUND

Most heliostats are designed and built like building structures. For example, most heliostats cannot change the position of the mirrors, i.e., move up or down, or change the drag surface area. Because the mirrors are fixed at a predefined position off of the surface, the heliostat may incur damage during severe weather such as high wind, hail, etc. The effectiveness of the heliostat may also be reduced due to settling dust, bird droppings, etc., and cannot rely on natural resources, such as rain, to clean the mirrors.

To address at least these issues, a heliostat with stowing capabilities would be beneficial.

SUMMARY

Certain embodiments of the present invention may be implemented and provide solutions to the problems and needs in the art that are outside the capabilities of conventional heliostats. For instance, some embodiments pertain to a low cost thin-film based heliostat with advanced stowing and wind survival capabilities.

In one embodiment, a heliostat includes a plurality of facets held together via a plurality of double acting magnetic hinges. The heliostat also includes a drive mechanism attached to a post, and configured to stow the plurality of facets in any position.

In another embodiment, an apparatus includes a drive mechanism configured to traverse in a forward direction or a backward direction a post stowing a plurality of facets in any position.

In yet another embodiment, an apparatus includes a drive mechanism configured to stow a plurality of reflective surfaces in a desired position when a chain drive moves the drive mechanism.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIGS. 1A and 1B illustrate a heliostat, according to an embodiment of the present invention.

FIG. 2 illustrates a drive mechanism, according to an embodiment of the present invention.

FIG. 3 illustrates a wheel configuration for the drive mechanism shown in FIG. 2, according to an embodiment of the present invention.

DETAILED DESCRIPTION OF THE EMBODIMENTS

Embodiments of the present invention pertain to a heliostat configured to stow a reflective surface. A reflective surface may be referred to as a mirror or facet. In some embodiments, the heliostat may survive winds up to 85 mph and operate in winds up to 35 mph. For example, the drag area of the heliostat may change and the azimuth drive may change when winds exceeds 35 mph. In particular, the azimuth drive may move in the direction of the wind to minimize wind loading, followed by moving the reflective surface to face down and horizontal to the position closest to the ground. This will place the heliostat in a position where the winds are lowest, near the ground, with minimum drag area. Furthermore, the abrupt change in the drag area will prevent any sudden wind gusts from any direction from destroying the heliostat.

The heliostat may also move the reflective surface to any horizontal position, and have the reflective surface face up or down at any elevation from the lowest above the ground to the maximum height allowed by the heliostat. This allows for easy maintenance and cleaning, and for protection against severe weather.

Figure 1A:
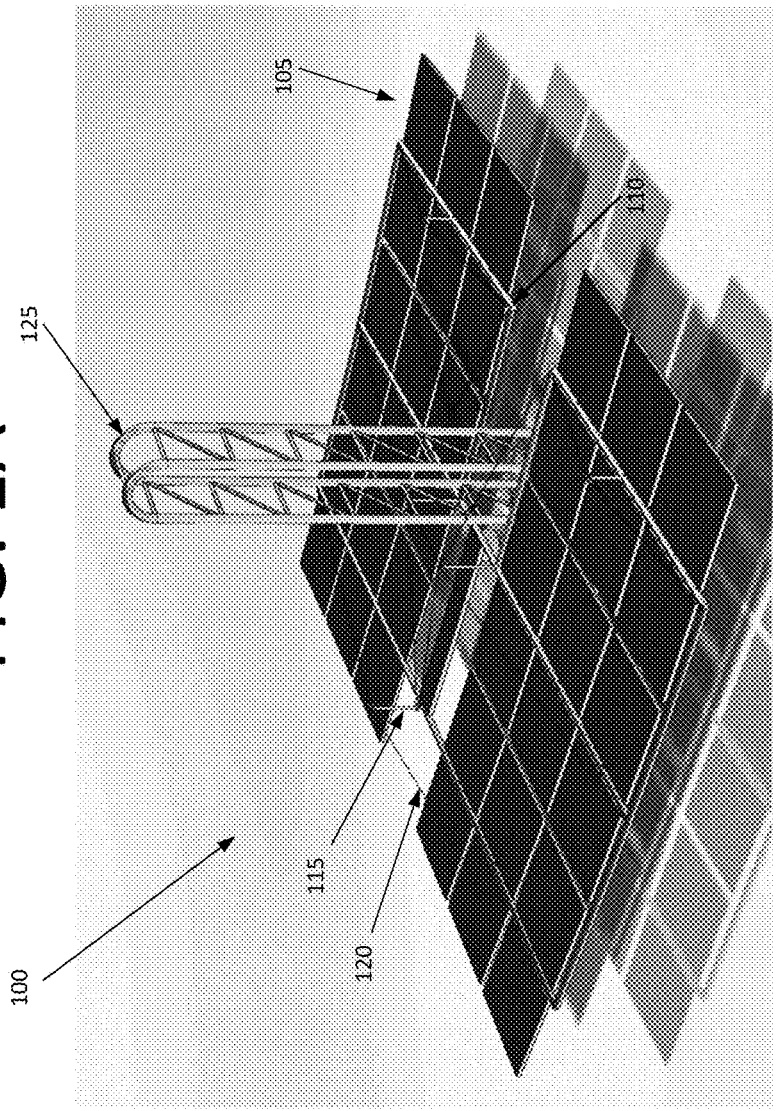

FIGS. 1A and 1B illustrate a heliostat 100, according to an embodiment of the present invention. Heliostat 100 may support any matrix of reflective surfaces 105 held together in an almost flat plane.

Spring loaded double acting hinges (or hinges) 110 hold reflective surfaces 105 in an almost flat plane. For example, each hinge 110 may include magnet(s) (not shown) to latch to one of the edges on each reflective surface 105. Hinges 110 and latching magnet may be implemented in many different configurations, allowing an abrupt release of reflective surface 105. Furthermore, hinges 110 allow for a controlled motion, such that reflective surfaces 105 will return to its original position and re-latch reflective surfaces 105 to its proper location with no intervention when the wind loads are reduced to appropriate levels. This enables any number of reflective surfaces 105 of any shape or size to be mounted to heliostat 100, minimizing cost and maximizing system performance for the specific characteristics (e.g., size, geometry, or material) of reflective surfaces 105.

Heliostat 100 also includes spars 115 and guy wires 120 located at various positions on hinges 110. This allows reflective surfaces 105 to move 90 degrees forward or backward on hinges 110, minimizing the front or rear drag surface area of reflective surfaces 105. Furthermore, spars 115 and guy wires 120 provide light weight structural support to reflective surfaces 105. For instance, spars 115 and guy wires 120 create a bend in reflective surfaces to provide depth and stability of reflective surfaces 105.

In one embodiment, a single notch is removed from the bottom of reflective surfaces 105 to enable reflective surfaces 105 to straddle post (or pylon) 125. Post 125 may be mounted on a horizontal azimuth drive. Post 125 may include two u-bend tubes forming a track allowing a drive mechanism 135 to move forward and backward, and around post 125. See, for example, FIGS. 2 and 3 for a more detailed description of drive mechanism 135.

Drive mechanism 135 is attached or connected to a plate 130, and plate 130 is attached to two hinges 110. This allows reflective surfaces 105 to move up or down along, or around, post 125 when drive mechanism 135 is moving. In one embodiment, a chain drive (not shown) may move drive mechanism 135. See, for example, FIG. 4, which shows a chain drive 400.

Figure 4:
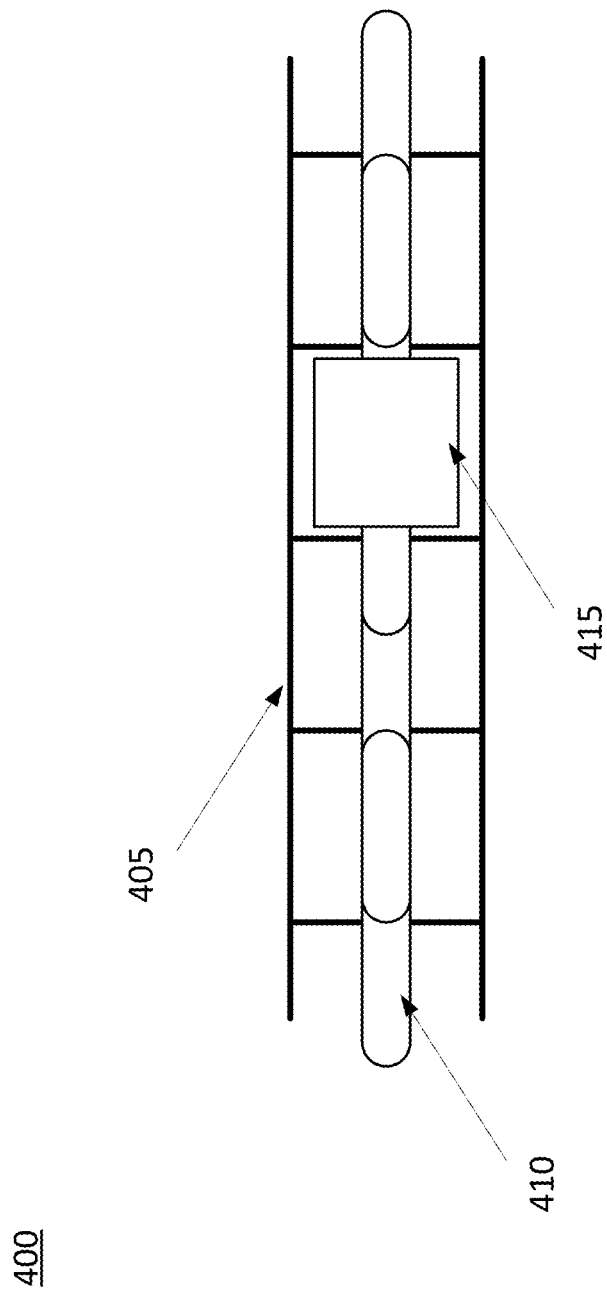
FIG. 4 illustrates a top view of a chain drive, according to an embodiment of the present invention.

In FIG. 4, post (or track) 405 has a chain 410. Connected to chain 410 is a drive mechanism 415. When chain 410 moves in a forward direction or a backward direction, drive mechanism 415 moves as well.

Figure 5:
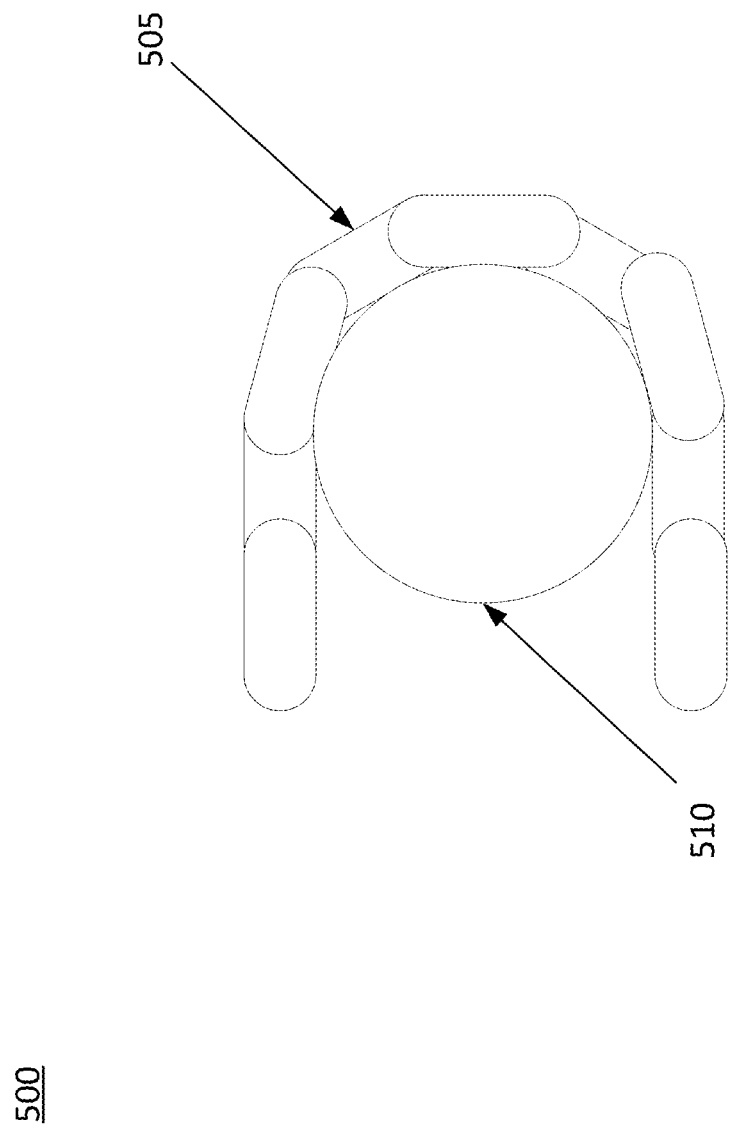
FIG. 5 illustrates a side view of the chain drive, according to an embodiment of the present invention.

FIG. 5 illustrates a side view of chain drive 500, according to an embodiment of the present invention. Although FIG. 5 shows one end of chain drive 500, a roller 510 is located at each end of chain 505. Roller 510 allows chain 505 to move in a forward or backward direction.

Returning to FIG. 1, in another embodiment, a built-in motor (not shown) may move drive mechanism 135 in a forward or backward direction.

It should be appreciated that the u-bend tubes on post 125 allows reflective surfaces 105 to be moved to any desired angle. See, for example, FIG. 1A for a first position and FIG. 1B for a second position. In FIG. 1A, reflective surfaces 105 are facing up, and are located near a surface or ground. FIG. 1B shows reflective surfaces 105 facing up at angle. In other words, depending on the position of drive mechanism 135 on post 125, reflective surfaces 105 may face up, down, or at any angle. Furthermore, the distance between the surface and reflective surfaces 105 may change depending on the position of drive mechanism 135.

It should also be appreciated that reflective surfaces 105 stowed horizontally and face down is in its most protective position and should withstand most desert conditions. For example, when reflective surfaces 105 are face down and near the ground, damage from wind or hail, as well as settling of dust, is prevented. The face up position (see FIG. 1A) of reflective surfaces 105 enables natural cleaning by the rain as desired at the optimum location.

In some embodiments, a separate power source may provide power to heliostat 100 via a power line. In another embodiment, heliostat 100 may include photovoltaic (PV) cells. In such an embodiment, the PV cell would provide power to the various components of heliostat 100.

In a further embodiment, heliostat 100 may include a communication unit. The communication unit may receive control messages from a control tower. The control messages may provide instructions to move drive mechanism to a certain position on heliostat 100. The communication unit may be a wireless device or physically connected to control tower via a communication line.

FIG. 2 illustrates a drive mechanism 200, according to an embodiment of the present invention. In this embodiment, drive mechanism 200 include a base 205 and a shaft 210. Shaft 210 is connected to plate 220. A more detailed explanation of plate 220 is provided above with respect to FIGS. 1A and 1B.

Wheels (or rollers) 215 are also attached to base 205, and are configured to move drive mechanism 200 in a forward direction or a backward direction. It should be appreciated that wheels 215 may be arrange, such that a set of wheels surround the track to secure drive mechanism 200 to the track. See, for example, FIG. 3.

Although not illustrated in FIG. 2, in some embodiments, base 205 may be connected to a chain drive. In those embodiments, when the chain drive begins to move, wheels 215 begin to move in the same direction as the chain drive causing drive mechanism 200, along with the reflective surfaces of the heliostat, to move. This enables stowage of the reflective surfaces in essentially any position desired based on wind, hail, rain, or maintenance requirements.

FIG. 3 illustrates wheel configuration 300 for drive mechanism 200 shown in FIG. 2, according to an embodiment of the present invention. In this embodiment, a set of wheels 305 surrounds one of tubes 315 of post (or track). This configuration secures the drive mechanism to the post. In a further embodiment, a third wheel may also be included for increase security. In such an embodiment, the third wheel may be perpendicular to set of wheels 305. Wheels 305 may be connected to each other via mounts 310.

In summary, a heliostat with stowing capabilities may be used in concentrating solar energy to a receiver at the top of a tower in, for example, the desert. The stowing capabilities of the heliostat allow for easy cleaning or maintenance of the reflective surfaces, as well as protection against severe weather such as wind, hail, dust storms, etc.

It should be appreciated that the heliostat's ability to stow the reflective surface face up during low wind rain storms allows for better cleaning and reduction in water usage in these typical desert environments. This also minimizes ground mud splashing effects during low wind rain storms. During higher wind rain storms, the height of the reflective surface may be reduced to minimize wind loading while allowing cleaning. The heliostat's ability to face the reflective surface down during low wind hail storms protects the reflective surface and minimizes dust settling on the reflective surface due to gravity. The stowed height in this position may also be reduced when winds increase while achieving the same goals.

It will be readily understood that the components of various embodiments of the present invention, as generally described and illustrated in the figures herein, may be arranged and designed in a wide variety of different configurations. Thus, the detailed description of the embodiments of the systems, apparatuses, methods, and computer programs of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A heliostat, comprising:
   a plurality of facets held together via a plurality of double acting magnetic hinges; and
   a drive mechanism attached to a post, and configured to stow the plurality of facets in any position wherein the drive mechanism comprises wheels configured to secure the drive mechanism to the post, and move the drive mechanism on the post.

2. The heliostat of claim 1, further comprising:
   a chain drive configured to move the drive mechanism on the post in a forward direction or backward direction.

3. The heliostat of claim 1, further comprising:
   a plurality of spars; and
   a plurality of guy wires, wherein
   the plurality of spars and the plurality of guy wires are configured to cause the plurality of facets to bend creating depth within the plurality of facets.

4. The heliostat of claim 1, wherein the post comprises two u-bend tubes, the two u-bend tubes form a track configured to allow the drive mechanism to move forward or backward on the post.

5. The heliostat of claim 1, wherein each of the plurality of double acting magnetic hinges comprises a magnet configured to latch to an edge of one of the plurality of facets.

\* \* \* \* \*